(12) United States Patent
Yates et al.

(10) Patent No.: US 7,015,529 B2
(45) Date of Patent: Mar. 21, 2006

(54) LOCALIZED MASKING FOR SEMICONDUCTOR STRUCTURE DEVELOPMENT

(75) Inventors: Donald L. Yates, Boise, ID (US); Garry A. Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/453,229

(22) Filed: Jun. 3, 2003

(65) Prior Publication Data

US 2003/0205749 A1 Nov. 6, 2003

Related U.S. Application Data

(62) Division of application No. 09/912,151, filed on Jul. 24, 2001, now Pat. No. 6,573,554, which is a division of application No. 09/258,471, filed on Feb. 26, 1999, now Pat. No. 6,358,793.

(51) Int. Cl.
*H01L 29/78* (2006.01)

(52) U.S. Cl. .................. 257/309; 257/296

(58) Field of Classification Search ............. 257/303, 257/306, 296, 301, 309
See application file for complete search history.

(56) References Cited

U.S. PATENT DOCUMENTS

| | | | |
|---|---|---|---|
| 5,034,348 A | 7/1991 | Hartswick et al. | 437/200 |
| 5,043,780 A | 8/1991 | Fazan et al. | 357/23.6 |
| 5,068,199 A | 11/1991 | Sandhu | 437/52 |
| 5,108,940 A | 4/1992 | Williams | 437/44 |
| 5,110,752 A | 5/1992 | Lu | |
| 5,130,885 A | 7/1992 | Fazan et al. | 361/313 |
| 5,150,276 A | 9/1992 | Gonzalez et al. | 361/303 |
| 5,162,248 A | 11/1992 | Dennison et al. | 437/52 |
| 5,168,073 A | 12/1992 | Gonzalez et al. | 437/47 |
| 5,185,282 A | 2/1993 | Lee et al. | 437/47 |
| 5,191,509 A | 3/1993 | Wen | 361/311 |
| 5,192,702 A | 3/1993 | Tseng | 437/47 |
| 5,213,992 A | 5/1993 | Lu | |
| 5,217,914 A | 6/1993 | Matsumoto et al. | 437/47 |
| 5,236,858 A | 8/1993 | Lee et al. | 437/47 |
| 5,244,842 A | 9/1993 | Cathey et al. | 437/228 |
| 5,266,514 A | 11/1993 | Tuan et al. | 437/52 |
| 5,278,091 A | 1/1994 | Fazan et al. | 437/52 |
| 5,290,729 A | 3/1994 | Hayashide et al. | 437/60 |
| 5,300,801 A | 4/1994 | Blalock et al. | 257/309 |
| 5,338,700 A | 8/1994 | Dennison et al. | 437/60 |

(Continued)

OTHER PUBLICATIONS

Mine, T., et al., "Capacitance-Enhanced Stacked-Capacitor with Engraved Storage Electrode for Deep Submicron DRAMs", *Extended Abstracts of the 21st Conference on Solid State Decives and Materials*, Tokyo,(1989),pp. 137-140.

(Continued)

*Primary Examiner*—David Nelms
*Assistant Examiner*—Quoc Hoang
(74) *Attorney, Agent, or Firm*—Schwegman, Lundberg, Woessner & Kluth, P.A.

(57) ABSTRACT

Container structures for use in integrated circuits and methods of their manufacture without the use of mechanical planarization such as chemical-mechanical planarization (CMP), thus eliminating CMP-induced defects and variations. The methods utilize localized masking of holes for protection of the inside of the holes during non-mechanical removal of exposed surface layers. The localized masking is accomplished through differential exposure of a resist layer to electromagnetic or thermal energy. The container structures are adapted for use in memory cells and apparatus incorporating such memory cells, as well as other integrated circuits.

13 Claims, 11 Drawing Sheets

U.S. PATENT DOCUMENTS

| | | | |
|---|---|---|---|
| 5,340,763 A | 8/1994 | Dennison | 437/52 |
| 5,340,765 A | 8/1994 | Dennison et al. | 437/52 |
| 5,362,666 A | 11/1994 | Dennison | 437/52 |
| 5,364,814 A | 11/1994 | McQueen | 437/52 |
| 5,366,917 A | 11/1994 | Watanabe et al. | 437/47 |
| 5,381,302 A | 1/1995 | Sandhu et al. | 361/305 |
| 5,384,152 A | 1/1995 | Chu et al. | 427/81 |
| 5,392,189 A | 2/1995 | Fazan et al. | 361/305 |
| 5,405,801 A | 4/1995 | Han et al. | 437/60 |
| 5,407,534 A | 4/1995 | Thakur | 156/662 |
| 5,411,912 A | 5/1995 | Sakamoto | 437/60 |
| 5,418,180 A | 5/1995 | Brown | 437/60 |
| 5,429,977 A | 7/1995 | Lu et al. | 437/52 |
| 5,429,978 A | 7/1995 | Lu et al. | 437/52 |
| 5,429,979 A | 7/1995 | Lee et al. | 437/52 |
| 5,444,013 A | 8/1995 | Akram et al. | 437/60 |
| 5,444,653 A | 8/1995 | Nagasawa et al. | 365/149 |
| 5,445,986 A | 8/1995 | Hirota | 437/60 |
| 5,447,878 A | 9/1995 | Park et al. | 437/52 |
| 5,466,626 A | 11/1995 | Armacost et al. | 437/60 |
| 5,468,671 A | 11/1995 | Ryou | 437/52 |
| 5,478,769 A | 12/1995 | Lim | |
| 5,478,772 A | 12/1995 | Fazan | 437/60 |
| 5,480,826 A | 1/1996 | Sugahara et al. | 437/52 |
| 5,481,127 A | 1/1996 | Ogawa | 257/308 |
| 5,494,841 A | 2/1996 | Dennison et al. | 437/52 |
| 5,498,562 A | 3/1996 | Dennison et al. | 437/52 |
| 5,506,166 A | 4/1996 | Sandhu et al. | 437/60 |
| 5,519,238 A | 5/1996 | Lu | |
| 5,554,557 A | 9/1996 | Koh | 437/52 |
| 5,565,372 A | 10/1996 | Kim | 437/52 |
| 5,573,968 A | 11/1996 | Park | 437/52 |
| 5,585,285 A | 12/1996 | Tang | 437/21 |
| 5,597,756 A | 1/1997 | Fazan et al. | 437/52 |
| 5,605,857 A | 2/1997 | Jost et al. | 437/60 |
| 5,607,874 A | 3/1997 | Wang et al. | |
| 5,608,247 A | 3/1997 | Brown | 257/306 |
| 5,618,746 A | 4/1997 | Hwang | 438/3 |
| 5,629,223 A | 5/1997 | Thakur | 438/398 |
| 5,634,974 A | 6/1997 | Weimer et al. | 117/103 |
| 5,639,689 A | 6/1997 | Woo | 437/193 |
| 5,648,291 A | 7/1997 | Sung | |
| 5,650,351 A | 7/1997 | Wu | |
| 5,652,165 A | 7/1997 | Lu et al. | |
| 5,658,381 A | 8/1997 | Thakur et al. | 257/309 |
| 5,663,090 A | 9/1997 | Dennison et al. | 438/398 |
| 5,663,093 A | 9/1997 | Tseng et al. | 438/396 |
| 5,670,405 A | 9/1997 | Tseng | |
| 5,670,406 A | 9/1997 | Tseng | |
| 5,670,425 A | 9/1997 | Schinella et al. | 437/195 |
| 5,693,557 A | 12/1997 | Hirao et al. | 437/60 |
| 5,702,968 A | 12/1997 | Chen | |
| 5,702,989 A | 12/1997 | Wang et al. | |
| 5,716,862 A | 2/1998 | Ahmad et al. | 437/41 |
| 5,719,418 A | 2/1998 | Jeng et al. | 257/303 |
| 5,759,262 A | 6/1998 | Weimer et al. | 117/88 |
| 5,770,500 A | 6/1998 | Batra et al. | 438/255 |
| 5,773,341 A | 6/1998 | Green et al. | 438/253 |
| 5,801,413 A | 9/1998 | Pan | 257/301 |
| 5,808,855 A * | 9/1998 | Chan et al. | 361/321.4 |
| 5,828,092 A | 10/1998 | Tempel | 257/295 |
| 5,830,793 A | 11/1998 | Schuegraf et al. | 438/255 |
| 5,859,760 A | 1/1999 | Park et al. | 361/313 |
| 5,882,979 A | 3/1999 | Ping et al. | 438/398 |
| 5,913,119 A | 6/1999 | Lin et al. | 438/255 |
| 5,959,327 A | 9/1999 | Sandhu et al. | 257/310 |
| 5,981,149 A | 11/1999 | Yamaguchi | 430/316 |
| 6,013,550 A | 1/2000 | Lee et al. | 438/253 |
| 6,015,733 A | 1/2000 | Lee et al. | 438/253 |
| 6,030,847 A | 2/2000 | Fazan et al. | 438/3 |
| 6,037,219 A | 3/2000 | Lin et al. | 438/255 |
| 6,046,083 A | 4/2000 | Lin et al. | 438/255 |
| 6,066,528 A | 5/2000 | Fazan et al. | 438/253 |
| 6,087,263 A | 7/2000 | Clampitt et al. | 438/700 |
| 6,096,598 A | 8/2000 | Furukawa et al. | 438/249 |
| 6,114,082 A | 9/2000 | Hakey et al. | 430/270.1 |
| 6,146,967 A | 11/2000 | Thakur et al. | 438/398 |
| 6,194,757 B1 | 2/2001 | Shinkawata | 257/306 |
| 6,251,742 B1 * | 6/2001 | Lin | 438/396 |
| 6,303,956 B1 | 10/2001 | Sandhu et al. | 257/306 |
| 6,313,022 B1 | 11/2001 | Howard | 438/594 |
| 6,376,328 B1 | 4/2002 | Aiso et al. | 438/398 |

OTHER PUBLICATIONS

Watanabe, H., et al., "Hemispherical Grain Silicon for High Density DRAMs", *Solid State Technology*, (Jul. 1992),pp. 29-33.

* cited by examiner

LOCALIZED MASKING FOR SEMICONDUCTOR STRUCTURE DEVELOPMENT

This application is a divisional of U.S. application Ser. No. 09/912,151 filed on Jul. 24, 2001, now U.S. Pat. No. 6,573,554, which is a divisional of U.S. application Ser. No. 09/258,471 filed on Feb. 26, 1999, now U.S. Pat. No. 6,358,793. These applications are incorporated herein by reference.

TECHNICAL FIELD

The present invention relates generally to development of semiconductor structures and in particular to development of semiconductor container structures using localized masking techniques.

BACKGROUND

Semiconductors are used extensively in today's electronic devices. Their miniature size and low power requirements enable highly complex circuits to be used in places never before thought possible. This has led to the development of systems with the speed and power to make our lives easier without encumbering us with bulky boxes and power-hungry electronics. One of the keys to both light weight and energy efficiency is the tiny size of the circuitry. With each new generation of circuit technology, comes smaller and smaller device sizes.

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor includes two conductive plates. The top plate of each capacitor is typically shared, or common, with each of the other capacitors. This plate is referred to as the "top cell plate." The charge stored across the capacitor is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell has two digit lines, digit and digit complement.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation, the selected word line activates the access transistors for a given word line address, and data is latched to the digit line pairs.

Some circuit devices utilize "container" structures, and such container structures are often utilized as a capacitor for a memory cell due to their efficient use of semiconductor die real estate. After formation, these container structures look like tiny holes within the surrounding material. They will generally have a closed bottom, an open top and sidewalls extending between the closed bottom and open top. Typically, containers that will be formed into capacitor structures will have dimensions that are taller than they are wide, often referred to as a "high aspect-ratio." This high aspect-ratio of container capacitors can allow the capacitor to store more energy while maintaining the same two-dimensional surface area. Conversely, the diameter of the hole can be reduced with no impact on energy storage to reduce the required surface area for the device. This allows for faster, smaller, and more energy-efficient devices to be constructed.

In order to further increase a container capacitor's ability to store energy, semiconductor manufacturers have moved towards a technology using hemispherical grain (HSG) polysilicon. HSG polysilicon processing provides a roughened surface, with individual grains of polysilicon protruding from the surface of the film inside the container, thereby increasing the effective surface area of the capacitor formed of the container. The combination of using high aspect-ratio structures and HSG polysilicon has produced semiconductors with much higher performance characteristics than previous structures, while maintaining the same amount of die real estate.

HSG polysilicon processing typically involves a blanket formation of HSG polysilicon over the entire surface of the supporting structure in which the containers are formed. Since the surface HSG polysilicon must be removed to define the individual container capacitors, this progression in technology has also introduced new problems to overcome, i.e., removal of unwanted HSG polysilicon while minimizing the introduction of defects caused by the removal process.

For example, container capacitors are usually formed in an insulating material, such as borophosphosilicate glass (BPSG). Next, traditional Low Pressure Chemical Vapor Deposition (LPCVD) processing deposits an HSG polysilicon layer over the entire support structure, including the inside of the container capacitor hole and as well as the entire surface of the support structure. The processing may also form HSG polysilicon on the backside of the support structure.

The HSG polysilicon on the surface and/or backside of the support structure is undesirable in the creation of container capacitors. The traditional method of removing the undesired HSG polysilicon uses a planarization process such as chemical-mechanical planarization (CMP). However, concern has arisen over the fact that the CMP process itself may inherently cause defects such as chatter marks, scratches, residue and CMP-related particle defects that are left as a result of the slurry. These defects may produce performance characteristics making the semiconductor structures unusable or of questionable quality and reliability.

Another concern of the CMP process is that grains of an HSG polysilicon surface are fragile and can become dislodged during the mechanical planarization process. A dislodged HSG polysilicon grain that bridges between two container capacitors may cause a cell-to-cell short leading to charge leakage and resultant improper performance. To help protect against such failures, cell formation processing includes the use of a fill material to mask and protect the container holes during CMP removal of surface HSG, as well as during subsequent removal of the surrounding BPSG. However, such techniques are not entirely effective against the mechanical strains induced by CMP.

A method of forming a patterned seed layer in trenches has been proposed by Schinella et al. in U.S. Pat. No. 5,670,425 issued Sep. 23, 1997. Schinella et al. relates to the forming of local area interconnects in an integrated circuit structure by selective deposition of certain conductive metal compounds over a seed layer previously formed in one or more trenches in an insulation layer wherein the one or more trenches have been previously formed in a pattern conforming to the desired interconnect configuration, so that the objectionable step of patterning a blanket deposited layer of a conductive metal compound can be eliminated. In accordance with one embodiment of the invention of Schinella et al., Schinella et al. propose a process in which a photoresist layer may be formed over an insulation layer and a seed layer thereon which will flow into coated trenches as well as over the portions of the seed layer deposited over the top surface of the insulation layer, forming a planar layer of photoresist. Schinella et al. then propose, in one embodiment, that to expose those portions of the seed layer not on a trench surface, the photoresist layer could be partially exposed to light energy (to only expose the top portion of the photoresist layer), and then conventionally developed to remove such exposed top portions of the photoresist layer. The seed layer of Schinella et al. normally may comprise any electrically conductive material which is capable of promoting subsequent selective deposition and/or growth of a conductive metal compound thereon which is capable of such selective deposition and/or growth. Although Schinella et al. does not address nor suggest the growth of HSG polysilicon on the seed layer of Schinella et al., HSG polysilicon may be formed using an appropriate seed layer. However, use of a seed layer for formation of HSG polysilicon results in a film that is stoichiometrically and/or physically different from blanket-deposited HSG polysilicon.

As noted above, the fragile nature of the HSG polysilicon grain surface requires special handling to reduce defects. Furthermore, the current preferred industry method of HSG polysilicon removal involving CMP may inherently introduce defects in the semiconductor structures. CMP may also result in dimensional variations in a cell array, as well as unwanted cross-wafer variation due to uneven removal rates. Accordingly, what is needed is a process that preserves the HSG polysilicon within the container capacitor while reducing defects and variations associated with the elimination of the surface and backside HSG polysilicon by conventional CMP.

SUMMARY

The present invention provides methods for developing semiconductor container capacitors, and apparatus utilizing such container capacitors. The invention reduces the defects and cost normally incurred with chemical-mechanical planarization (CMP) processing of container capacitors. The embodiments of the invention utilize localized masking of the container holes by selective exposure of resist. Although the following description is provided with reference to container capacitors utilizing hemispherical grain (HSG) polysilicon, it will be recognized by those skilled in the art that the methods presented herein are equally applicable to other semiconductor container structures and materials of construction, as well as other structures making use of such localized masking.

In one embodiment, a resist layer is formed overlying a first support layer and filling a hole in the first support layer. The resist overlying the surface of the first support layer is selectively removed by a method including exposing the resist layer to a level of energy sufficient to fully expose and develop resist above the sidewalls of the hole, while leaving at least a portion of the resist in the hole underexposed. In one embodiment, the resist layer is exposed to a controlled dose of energy, wherein at least a portion of the resist in the hole remains underexposed. In another embodiment, the resist layer is exposed using energy with an angled incident, wherein at least a portion of the resist in the hole remains underexposed. In a further embodiment, the resist layer is exposed using wave energy having a wavelength generally incapable of penetrating the hole, wherein at least a portion of the resist in the hole remains underexposed. In a still further embodiment, the resist layer is exposed using energy with an angled incident and having a wavelength generally incapable of penetrating the hole, wherein at least a portion of the resist in the container hole remains underexposed. In one embodiment, a second support layer is formed interposed between the resist layer and the first support layer.

In another embodiment, a resist layer is formed overlying an insulating layer and filling a container hole. The resist overlying the surface of the insulating layer is selectively removed by a method including exposing the resist layer to a level of energy sufficient to fully expose and develop resist above the sidewalls of the container hole, while leaving at least a portion of the resist in the container hole underexposed. In one embodiment, the resist layer is exposed to a controlled dose of energy, wherein at least a portion of the resist in the container hole remains underexposed. In another embodiment, the resist layer is exposed using energy with an angled incident, wherein at least a portion of the resist in the container hole remains underexposed. In a further embodiment, the resist layer is exposed using at least some wave energy having a wavelength generally incapable of penetrating the container hole, wherein at least a portion of the resist in the container hole remains underexposed. In a still further embodiment, the resist layer is exposed using energy with an angled incident and having a wavelength generally incapable of penetrating the container hole, wherein at least a portion of the resist in the container hole remains underexposed. In one embodiment, a container layer is formed interposed between the resist layer and the insulating layer.

In another embodiment, a resist layer is formed overlying a first support layer and filling a hole. The resist overlying the surface of the first support layer is selectively removed by a method including conducting thermal energy to the hole at an effective transfer rate higher than the effective transfer rate to the resist above the hole such that the resist in the hole is selectively hardened or baked relative to the resist on the surface. In one embodiment, a second support layer is formed interposed between the resist layer and the first support layer.

In yet another embodiment, a resist layer is formed overlying an insulating layer and filling a container hole. The resist overlying the surface of the insulating layer is selectively removed by a method including conducting thermal energy to the container hole at an effective transfer rate higher than the effective transfer rate to the resist above the container hole such that the resist in the container hole is selectively hardened or baked relative to the resist on the surface. In one embodiment, a container layer is formed interposed between the resist layer and the insulating layer.

In a further embodiment, a first resist layer is formed overlying a first support layer. The first resist layer is of a first resist type. A reticle is used to pattern the first resist layer to define a future hole. Subsequent to formation of the hole and removal of the first resist layer, a second resist layer is formed overlying the first support layer and filling the hole. The second resist layer is of a second resist type opposite the first resist type. The reticle is realigned over the hole and the second resist layer is patterned. Because the second resist type is opposite the first resist type, and the same reticle is used to pattern the second resist layer, an opposite pattern is produced in the second resist layer, thus forming a resist plug filling the hole and extending above the sidewalls of the hole. In one embodiment, a second support layer is formed interposed between the second resist layer and the first support layer.

In a still further embodiment, a first resist layer is formed overlying an insulating layer. The first resist layer is of a first resist type. A reticle is used to pattern the first resist layer to define a future container hole. Subsequent to formation of the container hole and removal of the first resist layer, a second resist layer is formed overlying the insulating layer and filling the container hole. The second resist layer is of a second resist type opposite the first resist type. The reticle is realigned over the container hole and the second resist layer is patterned. Because the second resist type is opposite the first resist type, and the same reticle is used to pattern the second resist layer, an opposite pattern is produced in the second resist layer, thus forming a resist plug filling the container hole and extending above the sidewalls of the container. In one embodiment, a container layer is formed interposed between the second resist layer and the insulating layer.

Further embodiments of the invention include semiconductor structures produced using one or more methods of the invention, as well as apparatus, devices, modules and systems making use of such semiconductor structures. Such structures are devoid of CMP-induced variations and defects.

It will be recognized that the methods of the various embodiments can be combined in practice, either concurrently or in succession. For example, controlled energy dosage may be combined with angled incident or energy having wavelengths generally incapable of penetrating the hole. Other permutations and combinations will be readily apparent to those skilled in the art.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Container Structures

Figure 1:
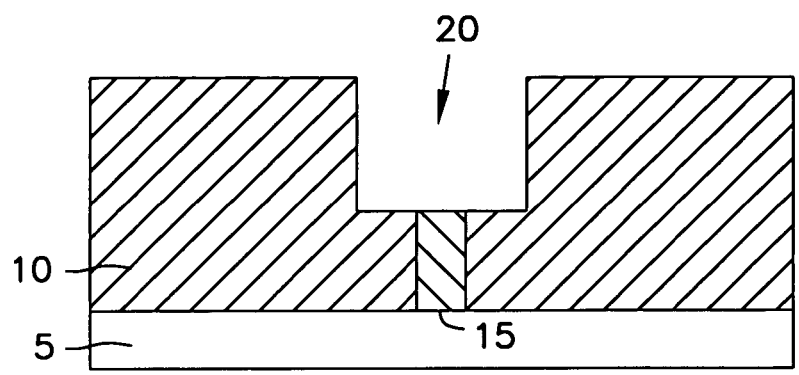
FIGS. 1–7 are cross-sectional views of a wafer during various processing stages in accordance with one embodiment of the invention.

In FIG. 1, after preparing a first support layer or, in this embodiment, insulating layer 10 and a buried contact 15 on the surface of a substrate 5 using conventional processing, one or more holes 20 are formed in the insulating layer 10, exposing a portion of contact 15. In this embodiment, hole 20 is a container hole used in the formation of a container capacitor. Container hole 20 has sidewalls defined by the surrounding insulating layer 10.

Container holes 20 are generally formed over active areas of the substrate 5 when forming a container structure for a capacitor in an integrated circuit. The processing for forming insulating layer 10 on the surface of substrate 5, as well as the processing for forming container holes 20 in insulating layer 10, are not detailed herein as such methods are well known to those of ordinary skill in the art.

Figure 2:
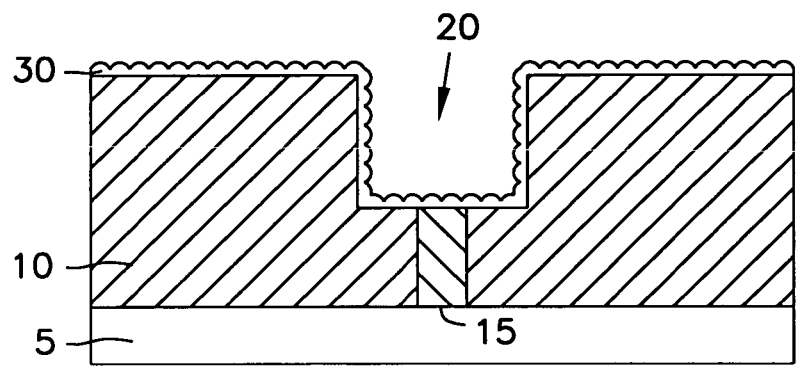

A second support layer or, in this embodiment, container layer 30 is then formed on substrate 5 and insulating layer 10 in FIG. 2. Container layer 30 is preferably hemispherical grain polysilicon (HSG) when used as a bottom plate of a capacitor. However, container layer 30 may further include other materials, such as amorphous silicon and polysilicon either singly or in combination. Similarly, insulating layer 10 is preferably borophosphosilicate glass (BPSG) when container layer 30 is used as a bottom plate of a capacitor, but insulating layer 10 may include other insulative materials, such as oxides or nitrides. Container layer 30, when used as a bottom plate of a capacitor should further be conductively doped for conductivity at some stage in the processing. Such doping may occur at any stage such as concurrently with formation of container layer 30, after formation of container layer 30, after removal of unwanted material from container layer 30, or at some other processing stage.

Figure 3:
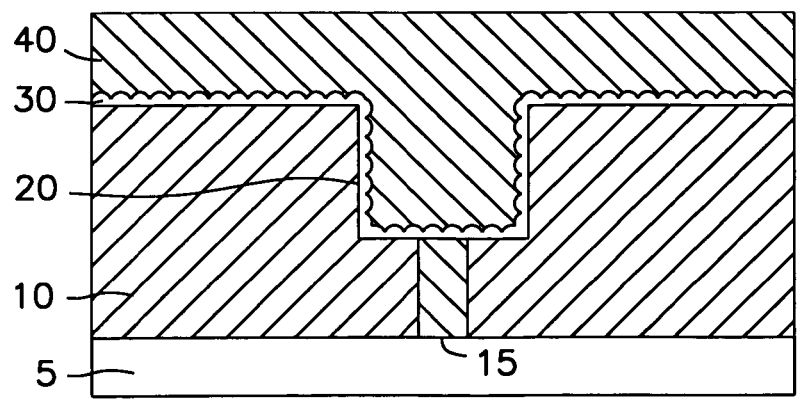

Following deposition or formation of container layer 30, resist layer 40 is formed overlying insulating layer 10 and container layer 30 as shown in FIG. 3. Resist layer 40 is preferably spun on. Typical thickness of resist layer 40 may be 0.5 to 1.5 $\mu$m. Resist layer 40 contains a resist material that is light or energy sensitive, such that resist material receiving exposure will have physical characteristics different from resist material not receiving exposure. Such resist materials are typically reactive to a specific set or range of energy types, e.g., a specific set or range of wavelengths of light.

Resist layer 40 fills container holes 20 to protect them during subsequent processing. Resist layer 40 is preferably OIR-897-10I photoresist produced by Olin Corporation or PFI 66A7 photoresist produced Sumitomo Chemical Co. LTD as used herein, although the invention is applicable to all photoresist compositions and technologies.

Figure 4:
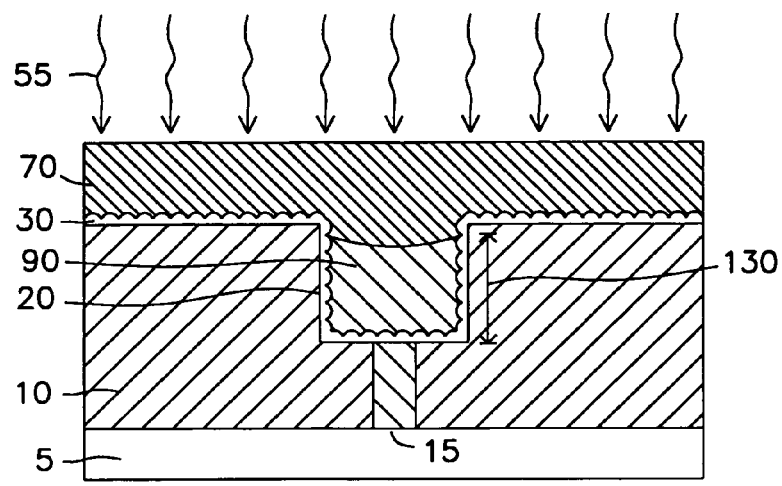

In FIG. 4, resist layer 40 is exposed to electromagnetic radiation or light waves 55, typically UV light, of a type capable of exposing the resist material in resist layer 40. Resist layer 40 contains photoresist material of a positive type, i.e., that which is more easily removed, or more vulnerable to solvents, when exposed to light or energy.

The duration and intensity of exposure to waves 55 should be of a level such that the resultant exposed resist portion 70 extends to container layer 30 on the surface of insulating layer 10, but such that an underexposed resist portion 90 remains in container hole 20. Due to the increased thickness of resist layer 40 above container hole 20, relative to the thickness overlying the surface of insulating layer 10, the duration and intensity of exposure to waves 55 can be controlled to sufficiently expose all of resist layer 40 overlying the surface of insulating layer 10 to permit removal of exposed resist portion 70 using conventional washing techniques, yet leave portions of resist layer 40 in container hole 20 insufficiently exposed to permit ready removal of underexposed resist portion 90 under similar conditions. The preferred exposure is between approximately 125 mJ and 200 mJ for the preferred resist materials. Adjustments to these preferred conditions will be necessary based on the thickness of resist layer 40 overlying the surface of insulating layer 10, the type of positive photoresist material chosen and the desired depth 130 of underexposed resist portion 90.

Figure 5:
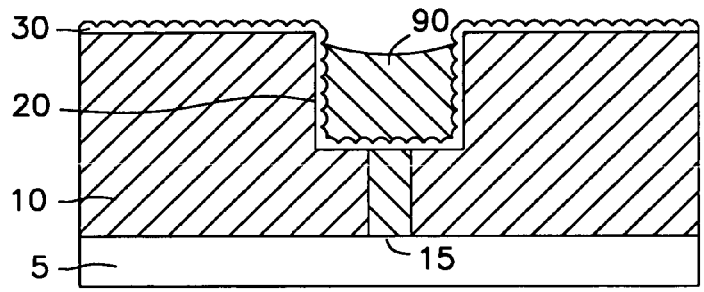
Figure 6:
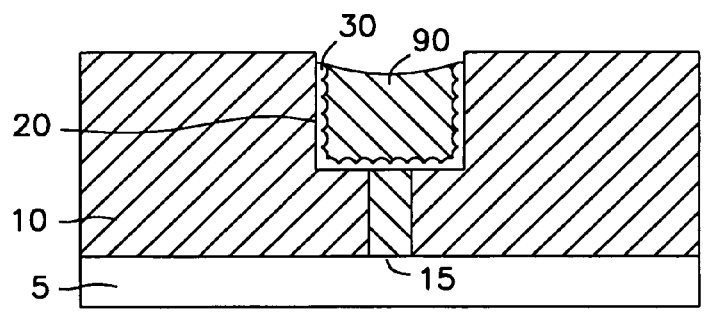

In FIG. 5, exposed resist portion 70 is removed conventionally, leaving underexposed resist portion 90 in container hole 20. Uncovered portions of container layer 30 are then removed in FIG. 6 without using CMP. A wet poly etch may be used where container layer 30 is HSG polysilicon. It is noted that the poly etch resulted in faster etch rates for doped HSG polysilicon than undoped HSG polysilicon. Splits using 2.25% TMAH [tetramethylammonium hydroxide, N(CH$_3$)$_4$OH] were used to drive the selectivity towards etching undoped HSG polysilicon faster than doped material. Other non-mechanical removal techniques may be used, such as alternative etch processes or chemical dissolution. It is noted that non-mechanical processes offer an additional advantage over traditional CMP removal of HSG polysilicon in that such non-mechanical processes are capable of removing both surface HSG polysilicon and backside HSG polysilicon simultaneously. CMP removal of surface HSG polysilicon must be followed by a separate removal of backside CMP as existing CMP processes are incapable of performing simultaneous planarization of both sides of the wafer.

Figure 7:
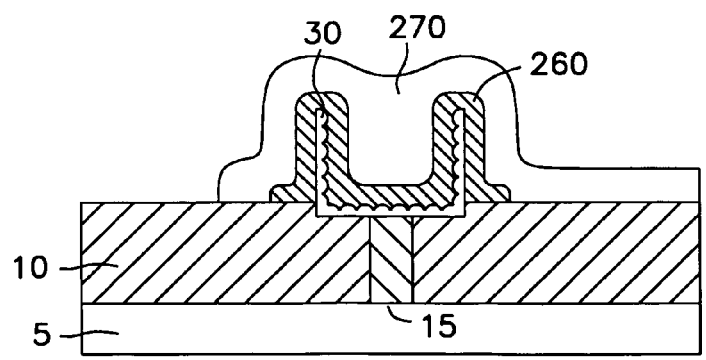
Figure 8:
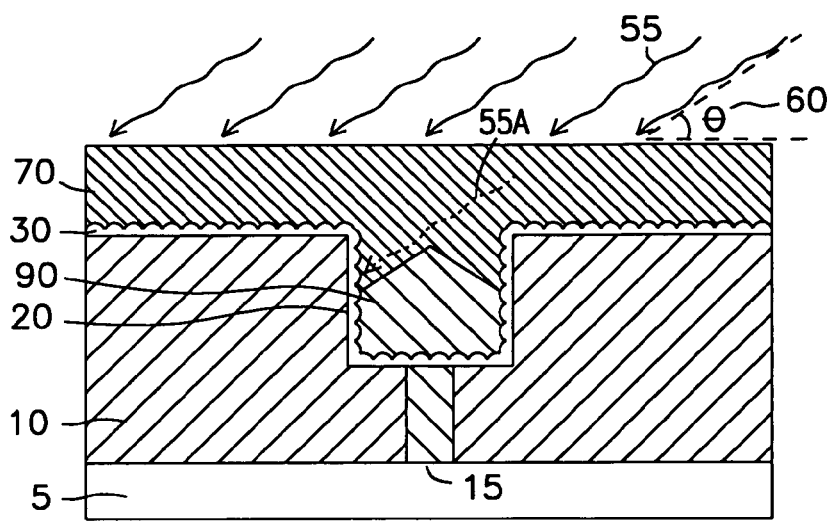
FIGS. 8–10 are cross-sectional views of a wafer during various processing stages in accordance with another embodiment of the invention.

Further processing may be performed to produce a container capacitor as shown in FIG. 7. The processing is well known and includes removal of underexposed resist portion 90 to expose the inside of the container, removal of a portion of insulating layer 10 to expose the outside of the container, formation of a dielectric layer 260 and formation of a cell plate 270. Removal of underexposed resist portion 90 may include such traditional methods such as using a hydrogen peroxide and sulfuric acid solution ("piranha etch" or "Carro's acid").

In another embodiment, processing proceeds as shown in and described with reference to FIGS. 1–3. Rather than adjusting intensity and duration of waves 55, waves 55 are directed at the surface at an incident angle 60 relative to the surface. By using an angled incident to expose the resist, intensity and duration of waves 55 become less controlling of the exposure as the waves 55 are not capable of exposing some portions of resist layer 40 inside container hole 20. Substrate 5 is preferably rotated about an axis generally perpendicular with the surface during exposure. Such rotation produces a cone-like structure in underexposed resist portion 90, such that exposed resist depth 80 on opposing sidewalls of container hole 20 are approximately equal. As an alternative, the source of waves 55 could be rotated about the same axis while the substrate 5 remains stationary to produce substantially similar results.

The incident angle 60 is adjusted to control the depth of penetration of the waves 55 into the container hole 20. A representative penetrating wave 55A illustrates how a desired exposed resist depth 80 is achieved for the container hole 20. Increasing the incident angle 60 will increase the penetrating depth into the container hole and, thus, increase the amount of exposed resist in the container hole 20.

The penetration depth 80 can also be controlled by varying the angle 60 in conjunction with variation of the wavelength of the waves 55. A larger wavelength will decrease penetration into the container hole 20 at a given incident angle. Similarly, if the wavelength is maintained, the penetration depth 80 can be increased by increasing the incident angle 60. Accordingly, both aspects can be varied simultaneously to produce a desired resist exposure in the container hole 20.

It should be recognized that because angle of incident has a significant impact on penetration of waves 55 into container hole 20, the light source itself does not need to be a single wavelength source. Generally, the light source contains wavelengths within a spectral range that (a) are selective to the resist used, i.e., will produce the desired reaction, and (b) will not penetrate the container at a given angle. Additional wavelengths that are not selective to the resist may be present, but need not be considered.

Figure 9:
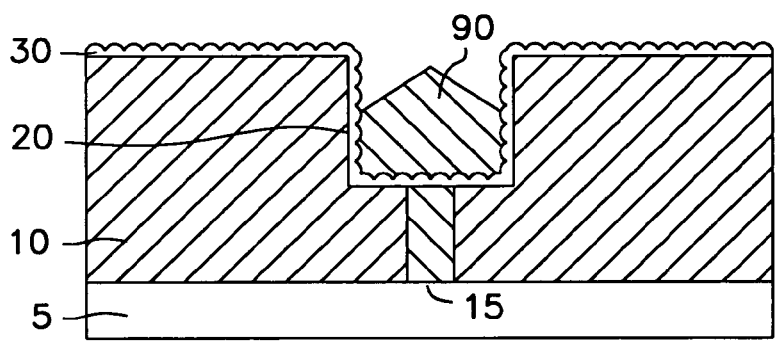
Figure 10:
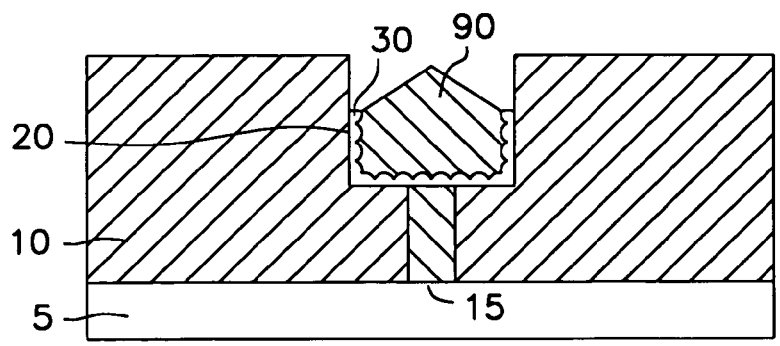
Figure 11:
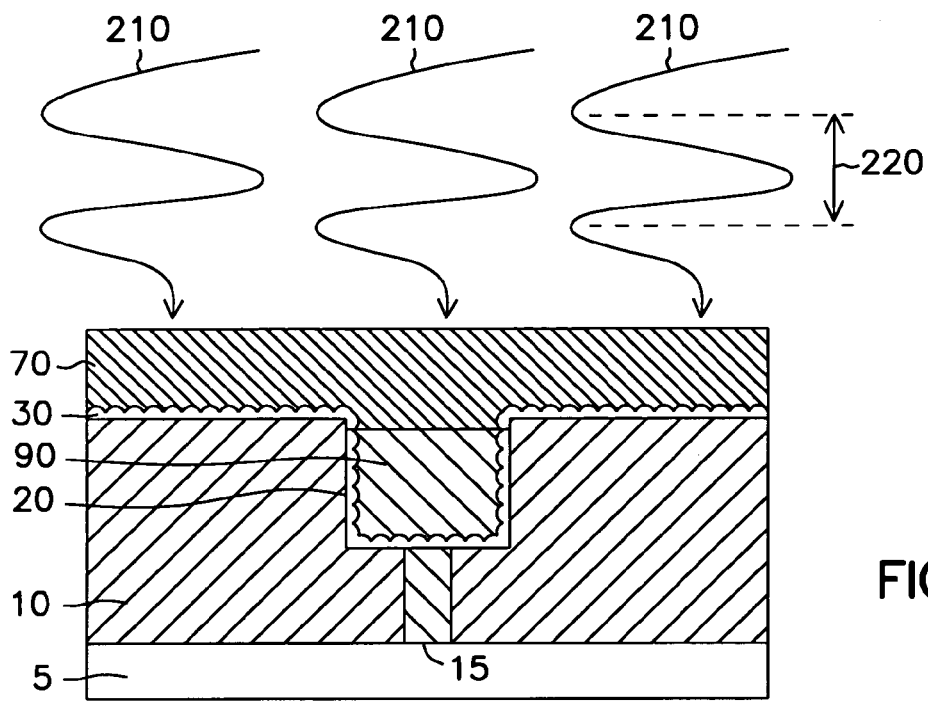
FIG. 11 is a cross-sectional view of a wafer in accordance with yet another embodiment of the invention.

Remaining processing proceeds in like fashion to the preceding embodiment. Exposed resist portion 70 is removed as shown in FIG. 9. Uncovered portions of container layer 30 are removed as shown in FIG. 10. And a container capacitor may be formed as shown in and described with reference to FIG. 7.

In still another embodiment, processing proceeds as shown in and described with reference to FIGS. 1–3. Rather than adjusting intensity and duration of waves 55 as in FIG. 4, waves 210 are chosen to have a wavelength 220 such that waves 210 are generally incapable of penetrating container hole 20. The absorption characteristics of the resist material can generally be described by the function:

$$\text{Absorption} = \text{Amplitude} * e^{-\alpha d}$$

where: Amplitude is the amplitude of the waves; and
d is the depth of the resist at which absorption is determined.

Further, α is generally described by the function:

$$\alpha \approx 4\pi k/\lambda$$

where: k is the absorption coefficient of the resist material; and
λ is the wavelength 220 of the waves 210.

Accordingly, increases in k or decreases in λ can be used to limit the depth of penetration by reducing absorption to a level that is too low to sufficiently expose the resist at the depths in container hole 20 for a given intensity of waves 210. Increases in k are accomplished by choosing a resist material having higher k values. Decreases in λ are accomplished by choosing an energy source emitting appropriate wavelengths.

It will be recognized that few light sources produce a single wavelength. Accordingly, waves 210 may often contain wavelengths 220 capable of penetrating container holes 20. However, it will be recognized that exposed resist portion 70 will receive exposure from all waves 210 and that underexposed resist portion 90 will receive reduced exposure given that some waves 210 will be incapable of penetrating container hole 20. Furthermore, resist layer 40 must be a positive resist reactive to at least some of the waves 210 having a wavelength 220. Where some waves 210 are both capable of penetrating container hole 20 and of causing a reaction in resist layer 40, controlled intensity and duration of waves 210 should be used such that resist portion 90 does not receive excessive exposure.

This embodiment may make use of photolithography technology commonly thought of as outdated. As an example, G-line photolithography technology can be used in this type of processing as resist materials for this technology have a relatively high k value. G-line generally refers to the 436 nm wavelength produced by a mercury light source, and has generally fallen out of service in photolithography due to resolution limitations caused by the relatively large wavelength.

Furthermore, in this embodiment it is the wavelength that controls the depth of penetration into container hole 20. Thus, the angle of the light or energy source is not critical and an incoherent flood-type exposure may be employed. A benefit of using a flood type exposure is that an entire wafer, or multiple wafers, can be exposed at once, eliminating the necessity of expensive stepping technology and increasing efficiency with resulting cost reduction. As one example, standard equipment used for bulk erasing of flash, typically a UV spectrum type of light source, can be used.

If a wavelength can interact and cause a change in the resist, then it must be of a size that generally prohibits interaction of the resist inside the container holes. If the wavelength does not cause a change in the resist, then it is unnecessary to filter it from the light source. Generally, the light source contains wavelengths within a spectral range that (a) are selective to the resist used and (b) will not penetrate the container.

Upon exposure of resist layer 40, remaining processing proceeds in like fashion to the preceding embodiments. Exposed resist portion 70 is removed then uncovered portions of container layer 30 are removed in like fashion to that shown in and described with reference to FIGS. 5–6 or 9–10. As in previous embodiments, a container capacitor may be formed as shown in and described with reference to FIG. 7.

Figure 12:
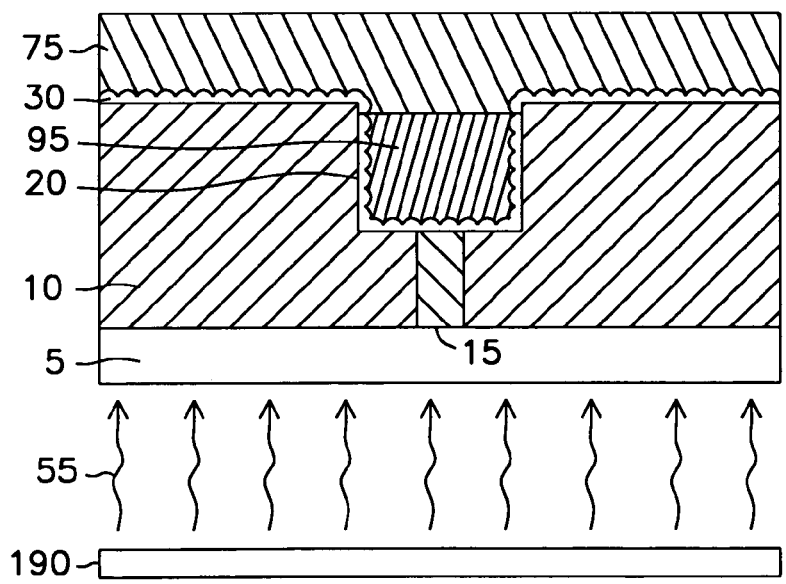
FIG. 12 is a cross-sectional view of a wafer in accordance with still another embodiment of the invention.

In a further embodiment, processing proceeds as shown in and described with reference to FIGS. 1–3. Rather than adjusting intensity and duration of waves 55 as in FIG. 4, heat or other energy from an energy source 190 is directed from below contact hole 20. The energy source 190 may utilize convective heat transfer or conductive heat transfer, or it may produce electromagnetic radiation or other radiated energy to be absorbed by the substrate 5. As shown in FIG. 12, waves 55 representing the energy transfer are directed at substrate 5 from below contact hole 20. The increase in thermal energy due to the absorption of waves 55 by substrate 5 will be transferred by conduction toward container hole 20. Resist layer 40 will absorb more thermal energy in container hole 20 than it will above the surface of insulating layer 10 as the material in container hole 20 will have more surface area per volume for accepting conductive energy transfer than material on the surface, as well as less surface area per volume for dissipation of absorbed energy. Accordingly, material in container hole 20 will be at a higher temperature than material at the surface until a steady state is reached. This differential of absorbed thermal energy and resultant temperature differential in resist layer 40 can cause resist portion 95 to harden more than resist portion 75, permitting the subsequent removal of resist portion 75 through conventional washing techniques while leaving behind resist portion 95. It will be apparent that this embodiment does not require the use of a photoresist material, but can make use of any material that hardens or becomes more resistant to washing or dissolution through the absorption of thermal energy or increase in temperature.

Upon hardening resist portion 95, remaining processing proceeds in like fashion to the preceding embodiments. Unhardened resist portion 75 is removed then uncovered portions of container layer 30 are removed in like fashion to that shown in and described with reference to FIGS. 5–6 or 9–10. As in previous embodiments, a container capacitor may be formed as shown in and described with reference to FIG. 7.

Figure 13:
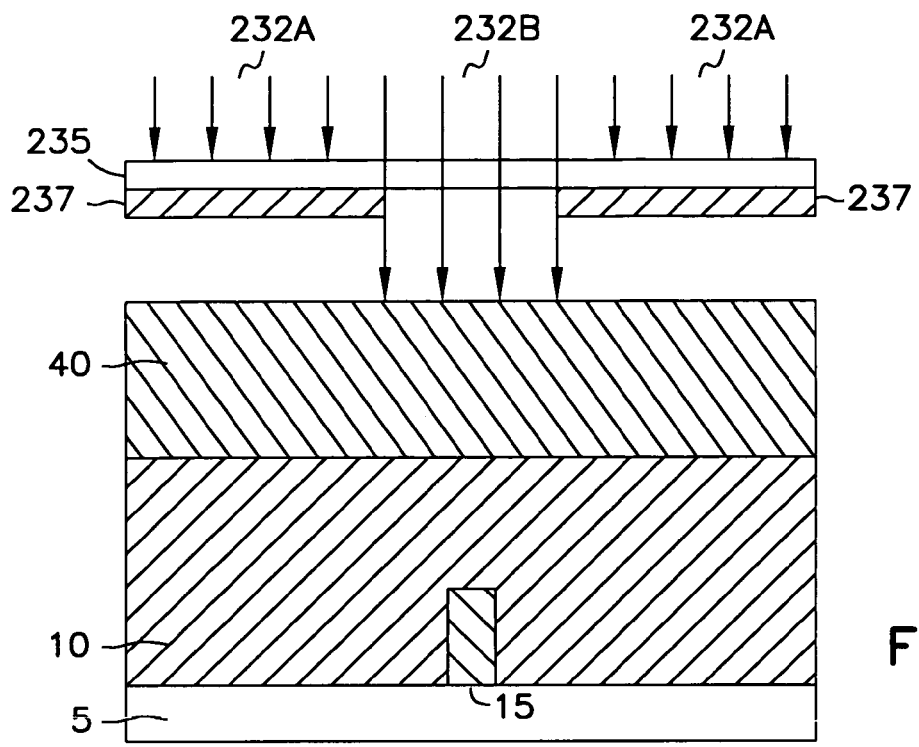
FIGS. 13–19 are cross-sectional views of a wafer during various processing stages in accordance with a further embodiment of the invention.

In a still further embodiment, an insulating layer 10 and buried contact 15 are formed on a substrate 5 through conventional processing in FIG. 13. It will be trivial to those skilled in the art that insulating layer 10 will be formed in at least two layers in order to form buried contact 15 below the surface of insulating layer 10. Furthermore, first resist layer 40 is formed overlying insulating layer 10. A reticle or mask 235 is used to define a future container hole. Waves 232 are directed toward the surface of first resist layer 40. Waves 232A are blocked by opaque regions 237 on mask 235 while waves 232B are allowed to expose first resist layer 40. As shown and used in FIG. 13, first resist layer 40 is a positive photoresist.

Figure 14:
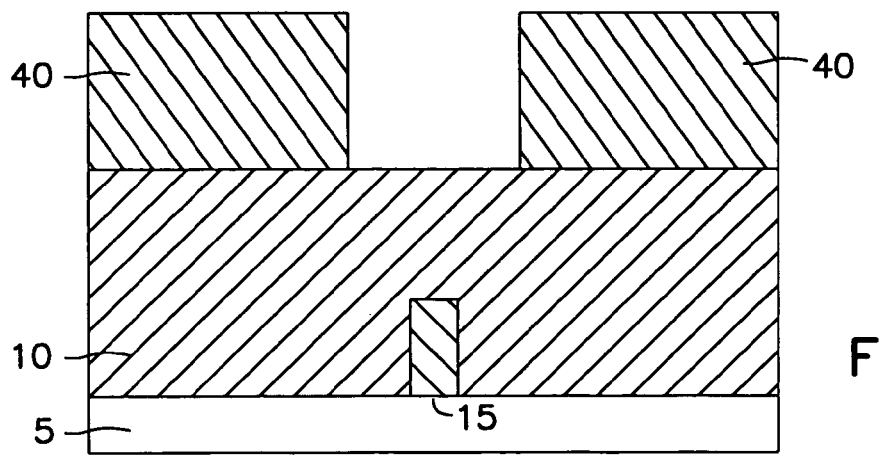
Figure 15:
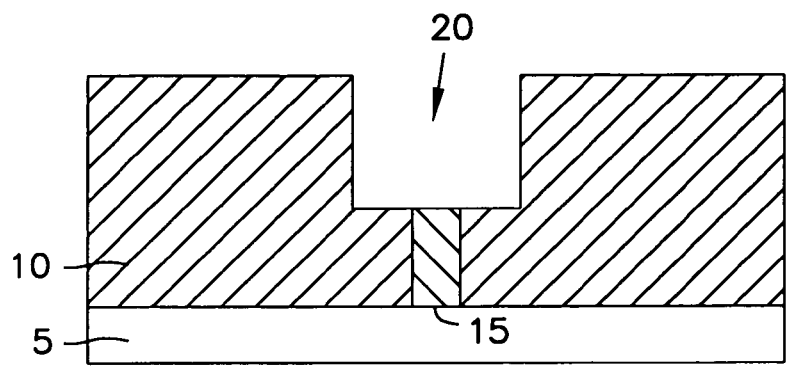
Figure 16:
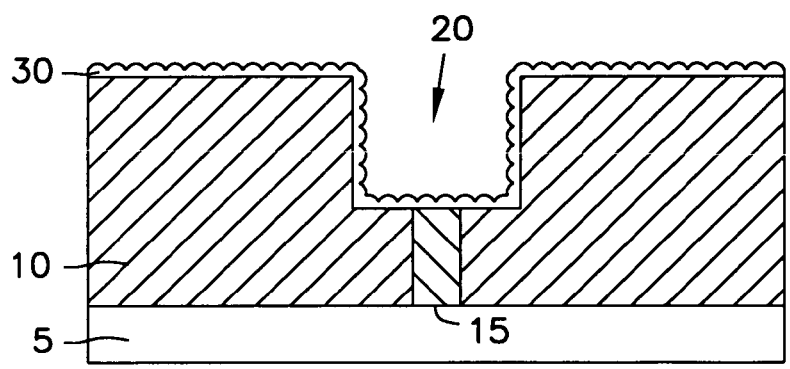
Figure 17:
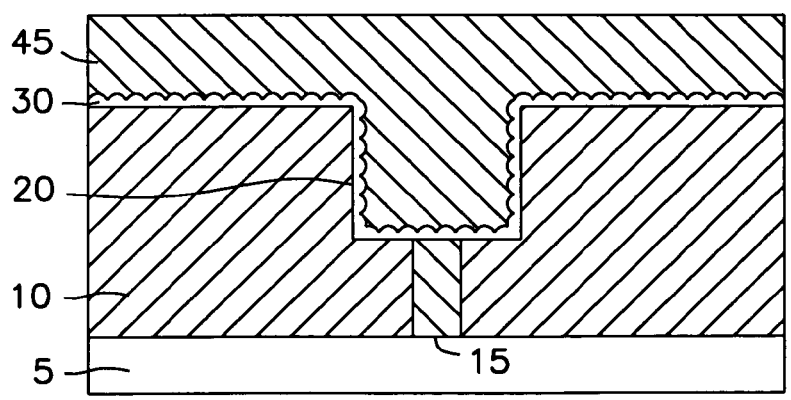

Upon development and washing, first resist layer 40 becomes patterned in FIG. 14 to define a future container hole. In FIG. 15, a portion of insulating layer 10 exposed by patterned first resist layer 40 is removed to define container hole 20, and first resist layer 40 is subsequently removed. In FIG. 16, container layer 30 is formed overlying insulating layer 10 and lining container hole 20. In FIG. 17, second resist layer 45 is formed overlying insulating layer 10 and filling container hole 20. In this embodiment, second resist layer 45 is of an opposite type to first resist layer 40, i.e., second resist layer 45 is a negative photoresist in this embodiment. Accordingly, exposed areas of second resist layer 45 are more resistant to removal than unexposed areas of the resist.

Figure 18:
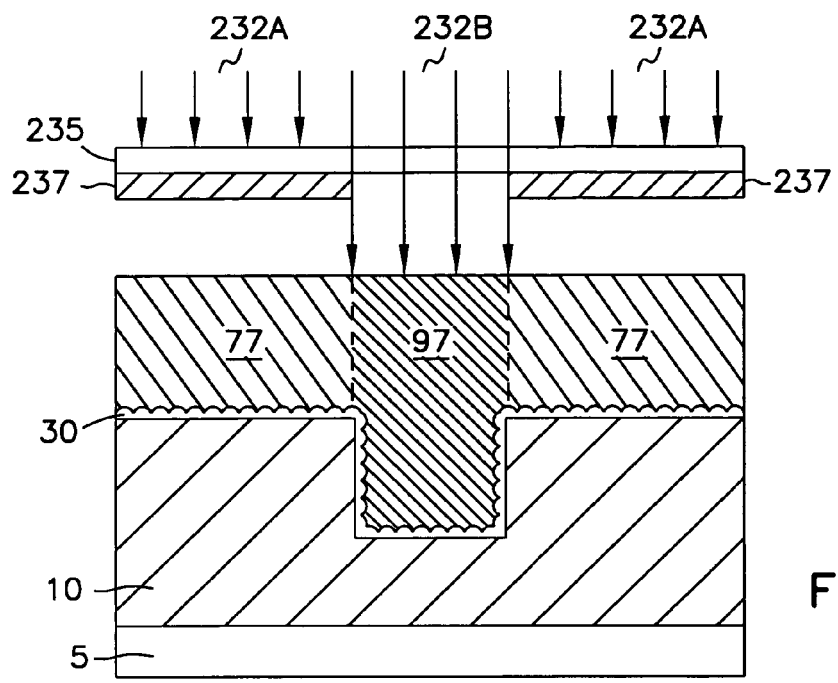
Figure 19:
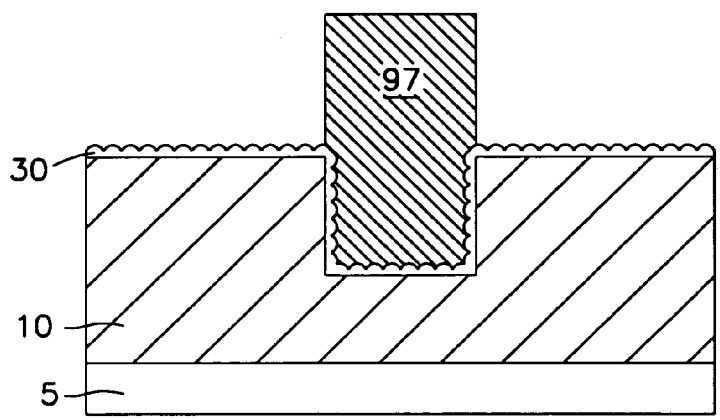

In FIG. 18, the same mask 235 is realigned with container hole 20 and waves 232 are directed toward the surface of second resist layer 45 creating exposed resist portion 97 and underexposed resist portion 77. As second resist layer 45 is a negative resist in this embodiment, upon development and washing of the second resist layer 45, only exposed resist portion 97 remains, as shown in FIG. 19.

Remaining processing proceeds in like fashion to the preceding embodiments. Uncovered portions of container layer 30 are removed in like fashion to that shown in and described with reference to FIGS. 5–6 or 9–10, with the trivial exception that exposed resist portion 97 extends above the sidewalls of container hole 20. As in previous embodiments, a container capacitor may be formed in like fashion as shown in and described with reference to FIG. 7.

It will be readily apparent to those skilled in the art that similar results could be obtained in this embodiment using a negative photoresist for first resist layer 40, with appropriate and obvious modification to reticle 235, and a positive photoresist for second resist layer 45.

Memory Cells

Figure 20:
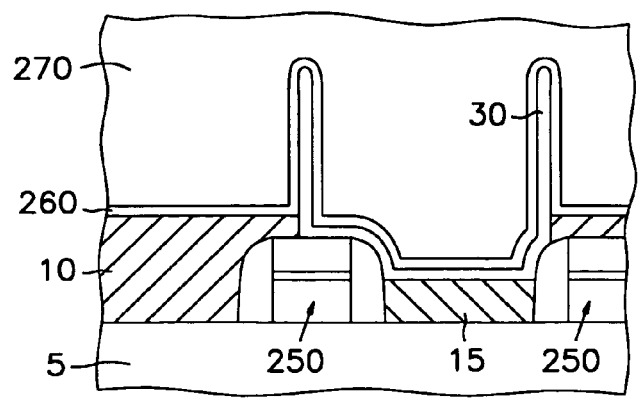
FIG. 20 is a cross-sectional view of a memory cell container capacitor in accordance with an embodiment of the invention.

FIG. 20 depicts one embodiment of a container structure as used in a container capacitor for a memory cell. The container structure is formed over a contact 15 to an active area of substrate 5. Container layer 30 is formed between adjacent word lines 250, having structures well understood in the art, and acts as the bottom plate of the container capacitor.

Container layer 30 is covered by a dielectric layer 260. Container layer 30 is formed in accordance with the invention. Dielectric layer 260 is an insulative material. Dielectric layer 260 is further covered by cell plate 270. Cell plate 270 is preferably conductively-doped polysilicon. Such memory cells are suitable for use in memory devices.

Memory Devices

Figure 21:
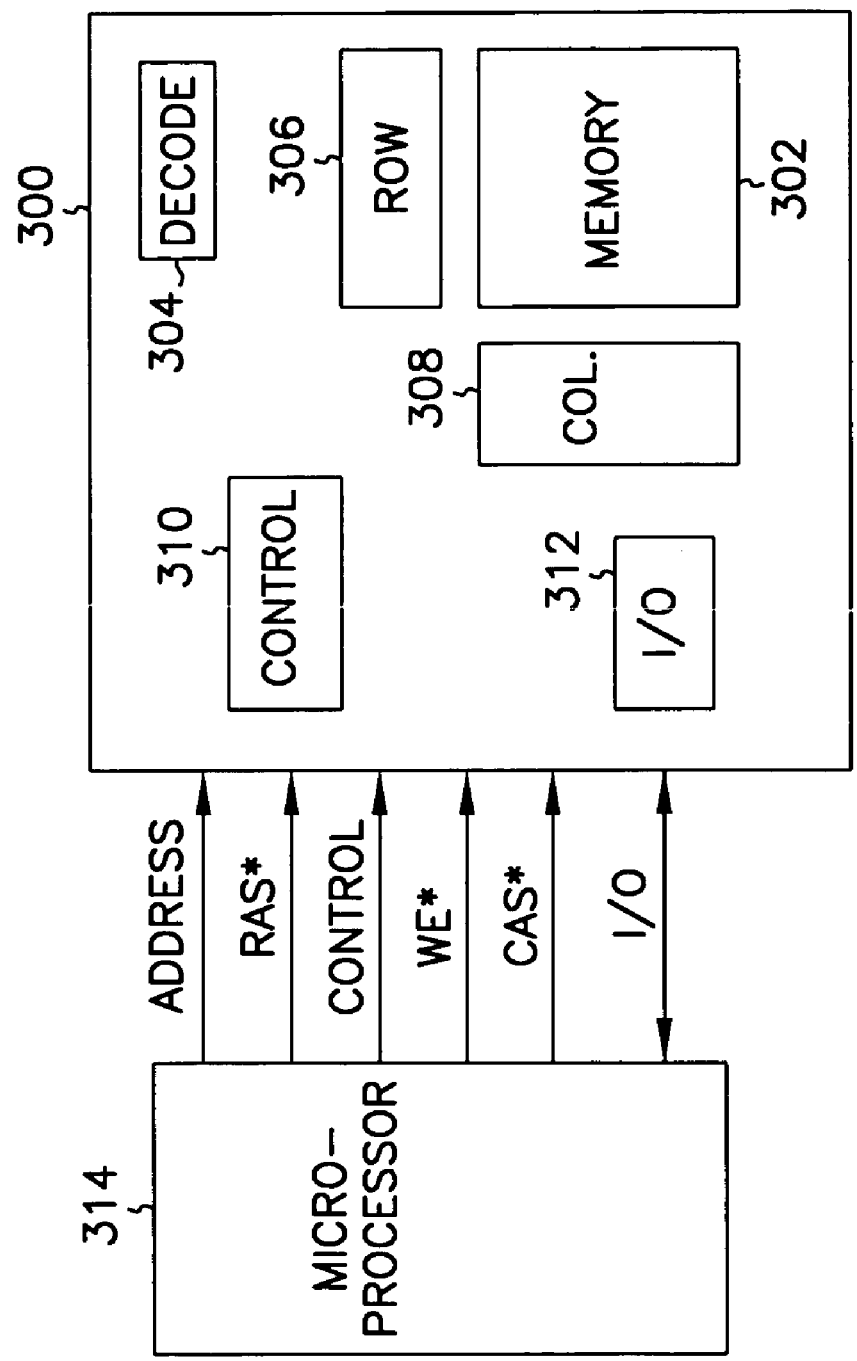
FIG. 21 is a block diagram of an integrated circuit memory device in accordance with an embodiment of the invention.

FIG. 21 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 21 has been simplified to help focus on the invention. At least one of the memory cells has a container capacitor of the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM 11, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 22:
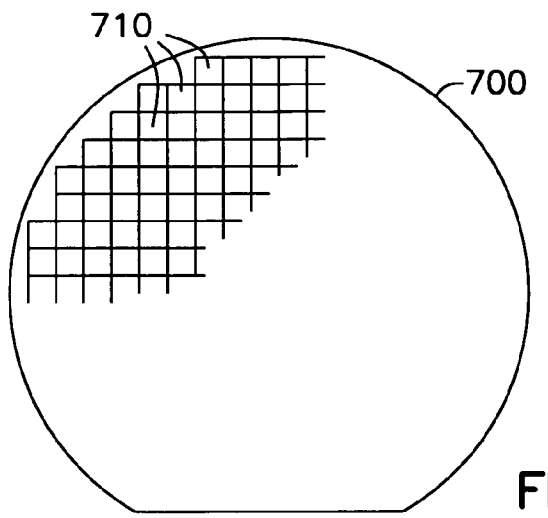
FIG. 22 is an elevation view of a wafer containing semiconductor dies in accordance with an embodiment of the invention.

With reference to FIG. 22, in one embodiment, a semiconductor die 710 is produced from a silicon wafer 700. A die is an individual pattern, typically rectangular, on a substrate that contains circuitry, or integrated circuit devices, to perform a specific function. At least one of the integrated circuit devices is a container capacitor as disclosed herein. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 23:
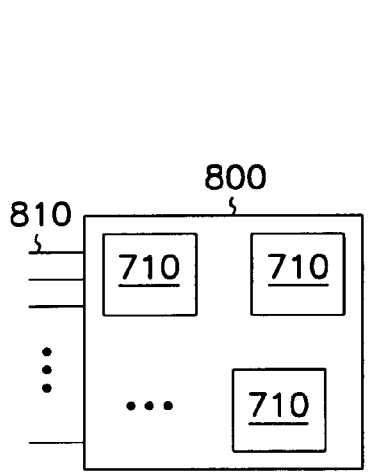
FIG. 23 is a block diagram of an exemplary circuit module in accordance with an embodiment of the invention.

As shown in FIG. 23, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 24:
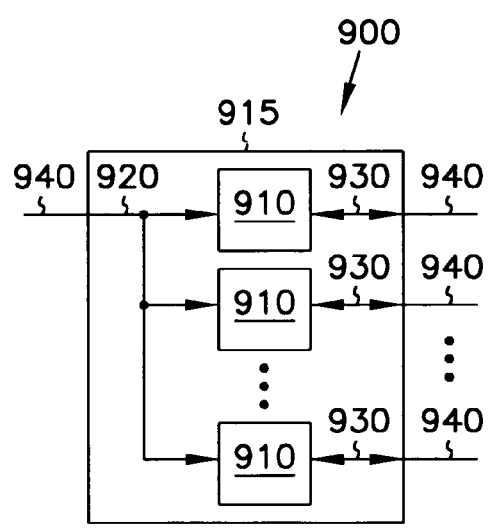
FIG. 24 is a block diagram of an exemplary memory module in accordance with an embodiment of the invention.

FIG. 24 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 24.

Electronic Systems

Figure 25:
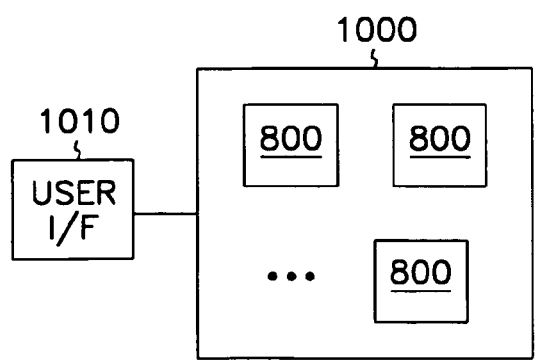
FIG. 25 is a block diagram of an exemplary electronic system in accordance with an embodiment of the invention.

FIG. 25 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 26:
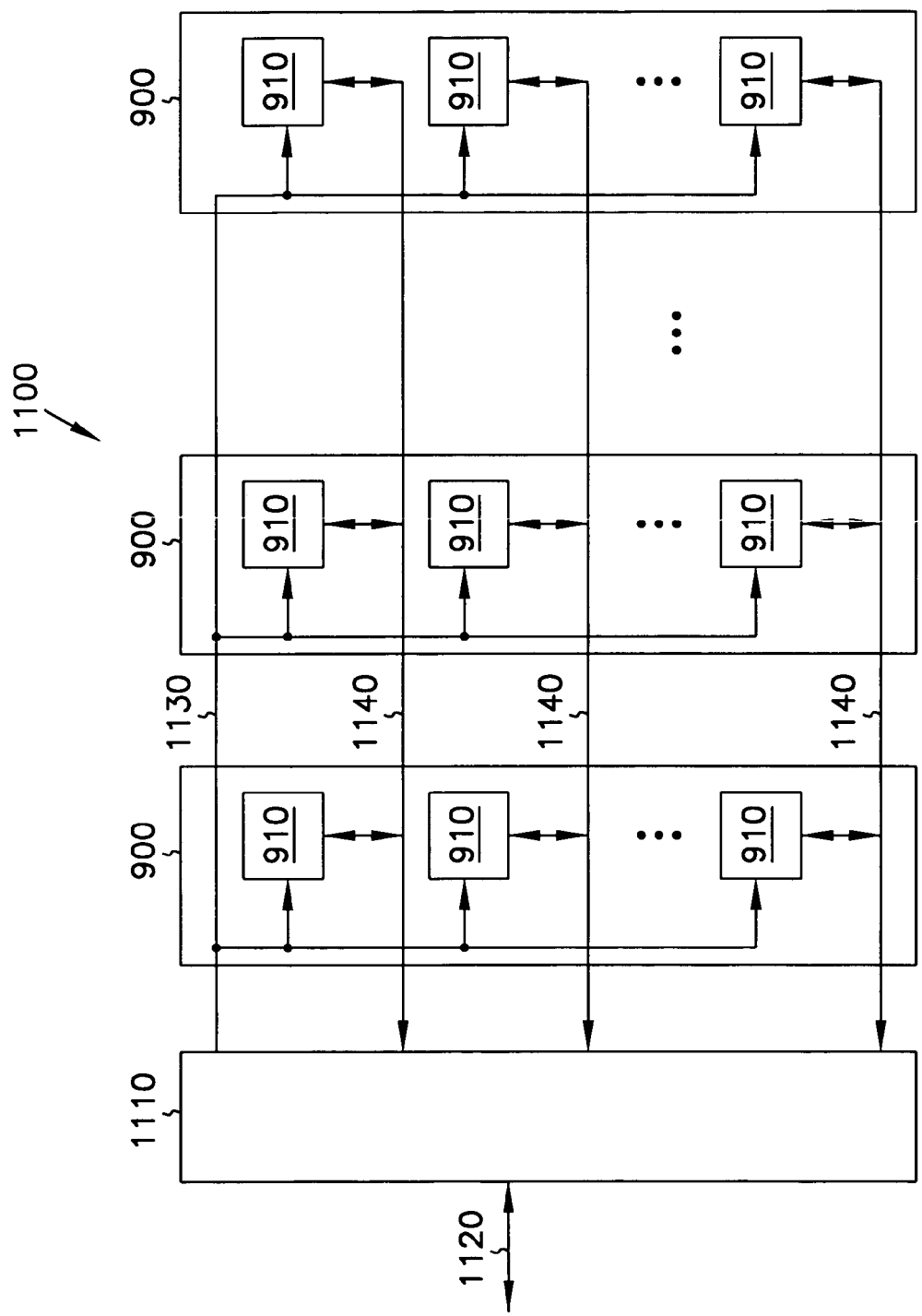
FIG. 26 is a block diagram of an exemplary memory system in accordance with an embodiment of the invention.

FIG. 26 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 27:
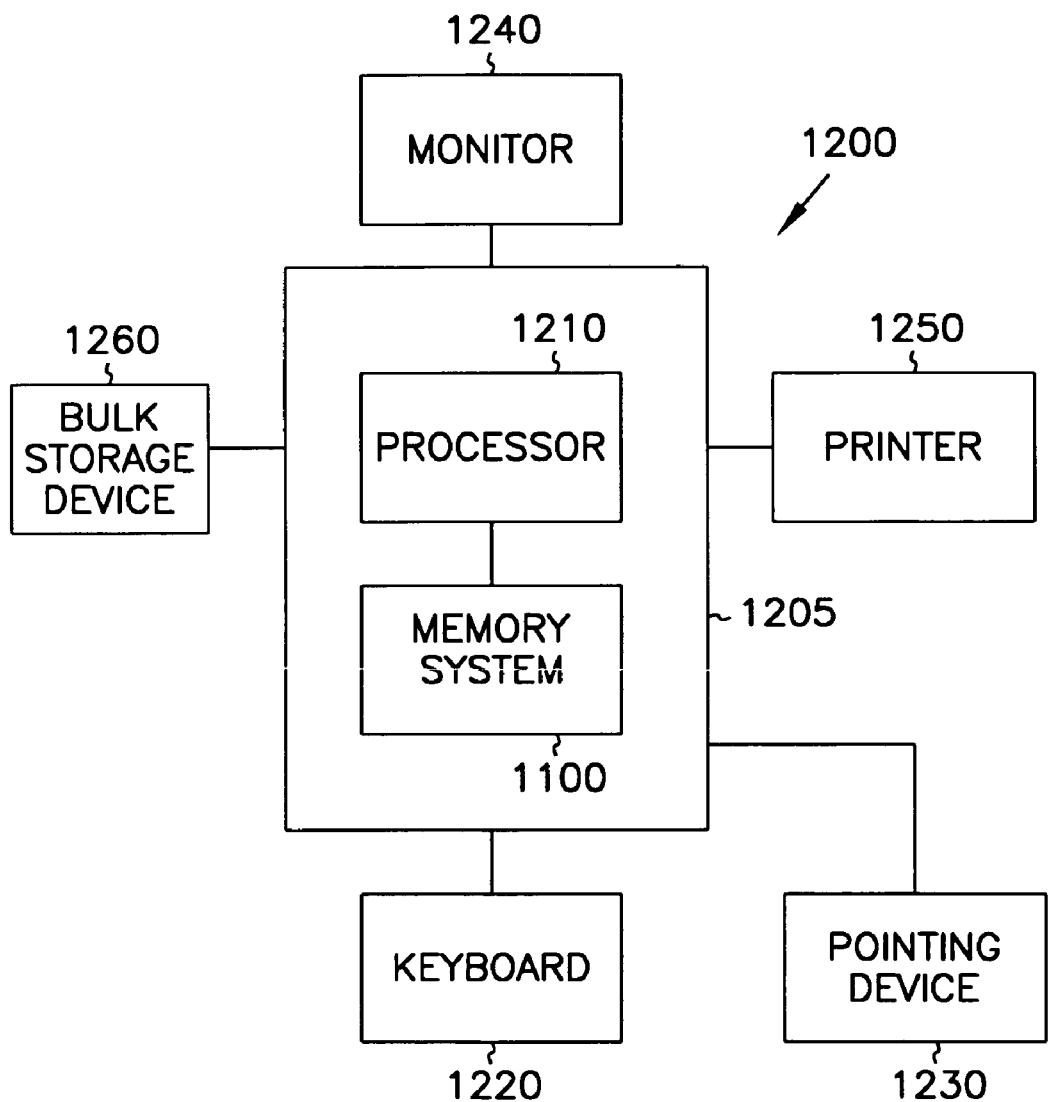
FIG. 27 is a block diagram of an exemplary computer system in accordance with an embodiment of the invention.

FIG. 27 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 27 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

CONCLUSION

Chemical-mechanical planarization (CMP) may inherently induce defects in the manufacture of integrated circuits. Traditional processing for forming container capacitors utilizes CMP. The invention provides methods of forming container capacitors without the need for CMP by providing localized masking of the container holes. Container capacitors of the invention are devoid of CMP-induced variations and defects. Such container capacitors are especially suited for use in memory cells, and various apparatus incorporating such memory cells.

While the invention has been described and illustrated with respect to forming container capacitors for a memory cell, it should be apparent that the same processing techniques can be used to form other container capacitors for other applications as well as other container-shaped structures.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A processing stage container capacitor, comprising:
   an insulating layer having a surface and overlying a substrate;
   a container layer at least on the surface of the insulating layer and sidewalls and closed bottom of a container hole formed in the insulating layer; and
   a negative type resist layer overlying the container layer and filling the container hole, wherein a first portion of the resist layer surrounding the container hole is underexposed, and wherein a second portion of the resist layer filling the container hole is substantially exposed.

2. The processing stage container capacitor of claim 1, wherein the insulating layer comprises at least one of borophosphosilicate glass, oxides and nitrides.

3. The processing stage container capacitor of claim 1, wherein the container layer comprises hemispherical grain polysilicon.

4. The processing stage container capacitor of claim 1, wherein the container layer is conductively doped.

5. A processing stage semiconductor die, comprising:
   an integrated circuit supported by a substrate and having a plurality of integrated circuit devices, wherein at least one of the plurality of integrated circuit devices is a container capacitor, the container capacitor comprising:
      an insulating layer having a surface and overlying a substrate;
      a container layer at least on the surface of the insulating layer and sidewalls and closed bottom of a container hole formed in the insulating layer; and
      a negative type resist layer overlying the container layer and filling the container hole, wherein a first portion of the resist layer surrounding the container hole is underexposed, and wherein a second portion of the resist layer filling the container hole is substantially exposed.

6. The processing stage semiconductor die of claim 5, wherein the insulating layer comprises at least one of borophosphosilicate glass, oxides and nitrides.

7. The processing stage semiconductor die of claim 5, wherein the container layer comprises hemispherical grain polysilicon.

8. A processing stage memory device, comprising:
   an array of memory cells, wherein at least one memory cell has a container capacitor, the container capacitor comprising:
      an insulating layer having a surface and overlying a substrate;

a container layer at least on the surface of the insulating layer and sidewalls and closed bottom of a container hole formed in the insulating layer; and a negative type resist layer overlying the container layer and filling the container hole, wherein a first portion of the resist layer surrounding the container hole is underexposed, and wherein a second portion of the resist layer filling the container hole is substantially exposed.

9. The processing stage memory device of claim 8, wherein the insulating layer comprises at least one of borophosphosilicate glass, oxides and nitrides.

10. The processing stage memory device of claim 8, wherein the container layer comprises hemispherical grain polysilicon.

11. A processing stage electronic system, comprising:
a processor; and
a semiconductor die coupled to the processor, wherein the semiconductor die comprises:
   a container capacitor, the container capacitor comprising:
      an insulating layer having a surface and overlying a substrate;
      a container layer at least on the surface of the insulating layer and sidewalls and closed bottom of a container hole formed in the insulating layer; and
      a negative type resist layer overlying the container layer and filling the container hole, wherein a first portion of the resist layer surrounding the container hole is underexposed, and wherein a second portion of the resist layer filling the container hole is substantially exposed.

12. The processing stage electronic system of claim 11, wherein the insulating layer comprises at least one of borophosphosilicate glass, oxides and nitrides.

13. The processing stage electronic system of claim 11, wherein the container layer comprises hemispherical grain polysilicon.

* * * * *